April 2, 1946. A. MURRAY ET AL Re. 22,741

PHOTOMECHANICAL PROCESS

Original Filed April 5, 1940

ALEXANDER MURRAY
JOHN A. C. YULE
INVENTORS

BY Wilson M. Parris

ATTORNEY

Reissued Apr. 2, 1946 Re. 22,741

UNITED STATES PATENT OFFICE 22,741

PHOTOMECHANICAL PROCESS

Alexander Murray and John A. C. Yule, Rochester, N. Y., assignors to Eastman Kodak Company, Rochester, N. Y., a corporation of New Jersey Original No. 2,319,079, dated May 11, 1943, Serial No. 408,642, August 28, 1941, which is a division of Serial No. 328,066, April 5, 1940. Application for reissue November 8, 1945, Serial No. 627,505

10 Claims. (Cl. 250—71)

This invention relates to photomechanical processes and particularly to processes for the reproduction of colors.

This is a division of our application Serial No. 328,066, filed April 5, 1940.

It is an object of the invention to provide a method and means for making color separation records which require little or no retouching in order to reproduce colors accurately.

It is also an object of the invention to provide such a method of making color separation records which will not require any step of color correction such as masking.

It is an object of the present invention to provide a method of making color separation positives directly from a colored original.

It is a particular object of the invention to provide a palette of artists' paints with which a picture can be painted, which picture will have the natural appearance desired and still can be reproduced directly without retouching.

It is an object of a special embodiment of the invention to provide a palette of artists' paints particularly adapted to be reproduced by a photomechanical process employing a black printer and a method of employing this palette of paints.

According to the present invention, an original painting to be reproduced photomechanically is created by the artist with inks, dyes, or paints, containing three fluorescent ingredients. For simplification the word paint will be used to cover all artists' coloring materials. These ingredients are such that their fluorescent hues are mutually separable spectrally. That is, they are of such flourescent color (e. g. violet, green, and red) that their spectral distribution of intensity curves do not overlap or if they do overlap, it is only partial and there is in each of the three hues one wave-length portion which is not in the other two. In either case, any one of the hues can be selected by a suitable color filter which absorbs the other two hues completely.

In simple theory the relative amounts of the three ingredients in each paint are proportional to the subtractive color contents of the hue of that paint. Actually they are also proportional to other factors to be discussed below. Roughly, the subtractive color contents are the amounts of yellow, magenta, and blue-green making up the hue; more exactly they are the amounts of minus blue, minus green, and minus red. We speak of primary color "components" (white is made up of all three primary colors) and of subtractive color "contents" (white has no subtractive color contents). For example, a yellow paint must contain only one of these fluorescent ingredients, a white paint if used and the white support for the original should contain no fluorescent ingredients. A black ink (or other black paint) must contain all three ingredients except in one special embodiment described later wherein it contains no fluorescent ingredients.

The other factors which determine the amounts of fluorescent ingredients in any one material are the fluorescent efficiency of the ingredient in each material and the amount of ingredient used in the other materials. Certain pigments absorb ultra violet and/or the fluorescent wavelengths themselves more than other pigments do. Thus a red pigment, say, may require ten times as much fluorescent ingredient as a yellow pigment in order to give the same effect. Thus the ingredients are effectively but not actually in proportion to the subtractive color contents of the materials. Furthermore the proportionality needs to be satisfied only for "each" of the three ingredients separately, not relative to one another because in the process, exposures are made separately to each fluorescent hue and need not be equal. For example in one particular set-up we have used, we expose 10 seconds for one hue and 5 minutes for another.

Positive color separations are made from this original by photographing it successively on three different photosensitive layers using fluorescent light only and in each case using only one of the fluorescent hues. This is accomplished by illuminating the original with fluoroactivating light such as ultra-violet (all visible light having been filtered out) and then by using suitable filters allowing one only of the fluorescent hues to reach the sensitive film in each case.

If a black printer is to be used, it may be prepared by any of the usual methods, but we prefer to use the method described by one of us in U. S. 2,161,378, Murray, since it combines uniquely with a special modification of the present invention. The result has the advantage that none of the color printers print where only the black printer need print, i. e. where the original picture is made up entirely of a black pigment.

To meet the requirements of U. S. 2,161,378, this special embodiment of the present invention employs coloring materials for creating the original which with exception of the black, reflect or transmit infra-red freely (i. e. do not absorb it). The black pigment used absorbs infra-red and an infrared separation negative makes a black printer which is a practically perfect one of the type which reproduces only those blacks and grays in the original which are made of the black pigment used in creating the original. To conform with the present invention in its simplest form, this black pigment would contain all three fluorescent ingredients since it includes all three subtractive colors. However, to gain the advantage of this special embodiment wherein no color printers will print where there is only black in the original, this black pigment is made up with no fluorescent ingredient, the same as white is.

Thus this special embodiment of the invention employs a palette of coloring materials for creating the original, which palette includes a black paint which contains no fluorescent ingredient and a plurality of other paints or inks which contain three flourescent ingredients in respective proportion to the subtractive color contents of the hues of these other coloring materials (fluorescent efficiency being taken into account as before). The color separation positives are then made in the same way as when intended for a three-color process and the black positive is made from an infrared separation negative.

Other objects and advantages of the invention will be apparent from the following description when read in connection with the accompanying drawing in which.

Figure 1:
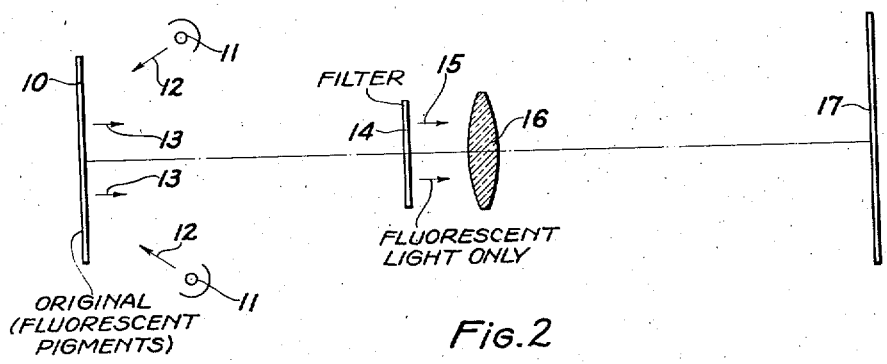
Fig. 1 illustrates one embodiment of the invention.

In Fig. 1 an original painting 10 including fluorescent pigments illuminated by sources 11 of illumination which send out fluoro-activating light indicated by arrows 12 which causes the original 10 to fluoresce. The light sources 11 are such (for example an ultra-violet arc with a filter to absorb the visible light) that none of the light 12 (before or after direct reflection by the original 10) is of the same wavelength as the fluorescent light. The light coming from the original 10 indicated by arrows 13 is made up of fluorescent light and reflected light. A filter 14 is placed in the path of this light from the original to absorb all wave lengths included in the light 12 and to transmit only fluorescent light 15. Of course the filter 14 may absorb some of the fluorescent light of the hue to be transmitted and always absorbs any fluorescent light of other hues. By means of a lens 16, a photosensitive layer 17 is in printing relation to the original 10 and is exposed by the fluorescent light 15.

According to the present invention, the original 10 is made up of pigments containing three fluorescent ingredients having different hues which are mutually separable spectrally. Therefore, the light 13 may include fluorescent light from all three fluorescent pigments and by proper selection of filter 14, the process illustrated in Fig. 1 successively gives three color separation positives. Alternatively one of the positives may be made by selecting a light source 11 which causes only one of the ingredients to fluoresce. For example, violet light may activate a red fluorescing ingredient without affecting the other ingredients which under ultra-violet would fluoresce green or blue.

Figure 2:
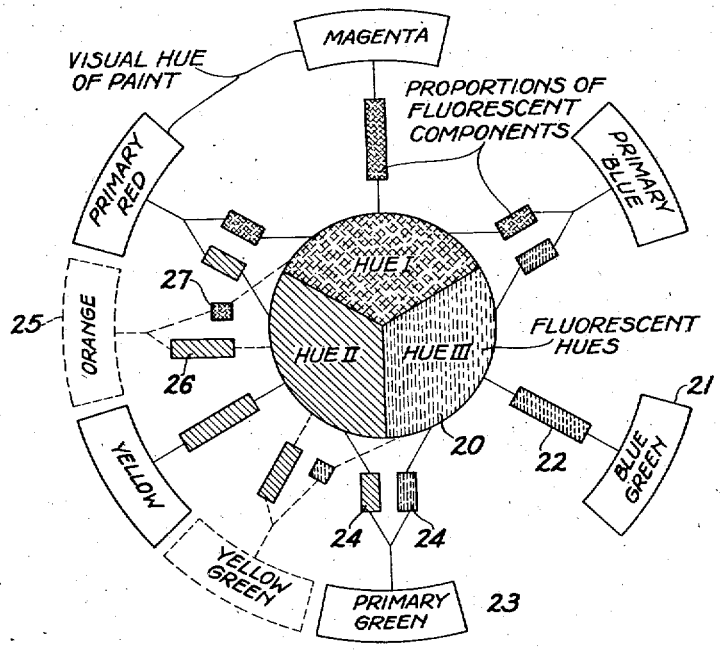
Fig. 2 illustrates the optical properties of the artist's color materials employed by the present invention.

Fig. 2 illustrates the composition of the paints used in creating the original 10. It is customary for an artist to employ three paints (or inks) magenta, yellow, and blue-green, and also various intermediate colors such as primary red, orange, etc. He may also employ a white and/or a black paint or ink. According to the invention each of these paints includes a fluorescent ingredient, the relative effective amounts of the ingredients in any one paint being in proportion to the subtractive color contents of that paint. As pointed out the actual amounts depend on the absorption of the fluorescent light and of the fluoro-activating light by the paint and on the amounts used in the other paints. For example, a magenta paint which contains no yellow or blue-green content would include only one of the ingredients, namely, that whose flourescent hue is labeled "Hue I" in circle 20. Similarly yellow would include only the ingredient having "Hue II" and blue-green would include only the ingredient having "Hue III." A primary red paint on the other hand would include effectively equal amounts of the ingredients having "Hues I and II." In this example, if the primary red paint absorb ultra-violet and light of hue I much more than the magenta paint, one would require more of hue I ingredient in the primary red paint than half of that in the magneta paint. The one-half value is predicted from simple theory. Also the actual proportion of the hue I ingredient to the hue II ingredient in the primary red paint depends on the relative efficiency of these ingredients and the exposures to be given for each hue. The amount of fluorescent ingredient in the blue-green paint 21 is illustrated by the block 22. The corresponding blocks for the magenta and yellow are the same size to indicate that with the differences in exposure taken into account, effectively equal amounts of the ingredients must be used. The amount of fluorescent ingredients in primary green 23 is illustrated by equal blocks 24, but of course this means that the relative amounts of the two ingredients in primary green must be such that their fluorescent intensities are effectively equal, when measured with respect to the spectral sensitivity of the photographic films to be used and the exposures to be given. Any intermediate color such as orange indicated by the broken line 25 would have relative amounts of the fluorescent ingredients indicated by the blocks 26 and 27 corresponding to the subtractive color contents of this hue—orange.

Since orange is made up mainly of yellow with a small amount of magenta the block 26 is larger than the block 27.

Another way of looking at this phase of the matter which is a little complicated because of the large number of factors involved, is in terms of the amounts of magenta, yellow and blue-green required in the final reproduction, which is, of course, directly in terms of the subtractive color contents, (applying the term to areas of the original in this case). This simplifies the mathematics because only the three colors are present. From this latter point of view, any areas on the original 10 requiring for their reproduction equal amounts of blue-green ink should have effectively equal amount of the hue III ingredient. That is, any blue, blue-green, or green areas whose brightnesses are such that they are equivalent in blue-green, require equal amounts of blue-green in their reproduction and hence should contain effectively equal amounts of hue III ingredient. A green area made of superimposing blue-green and yellow coloring materials will contain equal (effectively) amounts of the corresponding ingredients and will of course contain just as much hue III ingredient as when the yellow is omitted and only blue-green is used. However, when all of this is transferred from a discussion of areas to one of coloring materials on a palette, a green paint contains only half as much (effectively) of ingredient "Hue III" as does a blue-green paint. The point is that over a unit area there is twice as much paint when the yellow is added as when the blue-green is alone so that the proportion of hue III ingredient to total paint is halved although the proportion to area is unchanged.

The actual fluorescent hues of the fluorescent ingredients are immaterial. For example hue I may be violet, hue II may be green and hue III may be red. As long as the fluorescent hues are mutually separable spectrally, it does not matter in what order they appear in circle 20.

By selecting the proper amounts of fluorescent ingredients in each of the paints, all or most retouching is eliminated from subsequent processes. The difficulty in compounding a paint which has exactly the correct fluorescence throughout all of its range of tints may in some cases result in slightly excessive brightness of the pastel shades, but any retouching required is considerably less than that formerly used and for most purposes for which we have used this process, no retouching has been necessary. The amount of fluorescent ingredient indicated by the block 22 in the blue-green paint 21 should be effectively proportional to the density required in a blue-green separation positive forming the blue-green printer. Similarly, the amounts of the ingredients represented by the blocks 24 should correspond to the required printer-densities to be used with the yellow and blue-green inks in the final process to reproduce primary green as it appears in the original. That is, the blocks 22, 24, 26, and 27 are representative of the effective amounts of fluorescent ingredients required in terms of final printer densities required.

From Fig. 2, it is obvious that the present invention must result in positives directly. When using ordinary non-fluorescent pigments, the more of the pigment present at any point the greater is the optical density of that point. In the present case however, a large amount of pigment corresponds to a large amount of fluorescent material and hence to increased brightness. Thus the film 17 when processed has a high density (due to high brightness of fluorescence) wherever the original has a high density of pigment. Thus the result is a positive.

The fluorescent ingredients used may or may not have any visual coloration in ordinary light. If they have a visual coloration, it is of course desirable to select the arrangement of fluorescent hues in the circle 20 so that the visual hues of the fluorescent ingredients (not their fluorescent hues which are labeled I, II, and III) correspond most nearly to the visual hues of the paints in which they are to be used. It is also desirable that the fluorescent ingredients be chemically stable and stable to light and to exposure to the atmosphere. For aqueous paints the fluorescent ingredients are preferably non-volatile, water insoluble, pulverable materials of relatively low optical density, in their own visual color, but of high density to ultra-violet to increase fluorescence efficiency. The following fluorescent materials are satisfactory when used with mercury vapor lamps as a source of fluoro-activating light: chrysene, anthracene with a trace of naphthacene (or chrysene with 1% naphthacene) and rhodamine G precipitated with a water insoluble gum or resin.

Chrysene when illuminated with light of 365 millimicron wave length through a filter (such as Corning Glass Co. #584) absorbing the visible spectrum fluoresces with a violet light of about 400 to 450 millimicrons. A filter (such as a combination of Wratten #34 and Wratten #2A) transmitting only this latter wave length band or part of it, may be used over a camera by which a color separation positive is to be made. Since this latter filter combination transmits red, only ortho or blue-sensitive emulsions should be used therewith or a red absorbing filter should be added to the combination.

Pure anthracene plus 1 per cent naphthacene when excited by ultra-violet light of the same wave length (365) fluoresces in the green region from about 500 to 600 millimicrons. A Wratten #61 filter used over the camera will prevent fluorescent light from the other ingredients reaching the film or if ortho films are used, an ordinary yellow filter will do. In a copending application by one of us (Yule) serial number filed concurrently herewith an alternative green fluorescent material consisting of chrysene recrystallized with 1% naphthacene is described.

One per cent rhodamine G in sandarac resin when illuminated by a mercury vapor lamp directly (i. e. no filter over the lamp) is excited by the 546 and 577 millimicron lines of mercury and fluoresces in the 600 to 700 millimicron region of the spectrum. A Wratten #25 red filter on the camera lens prevents both the light from the mercury vapor arc and the fluorescent light of the other ingredients reaching the film.

While the specific intensity ratios and quantities of the fluorescent ingredients will vary with the types of emulsion used in the camera, the transmissions of the filters and the nature of the printing inks to be used, we have found that the following paints are satisfactory for creating an original to be reproduced by a process using commercial inks now in use and with regular panchromatic or orthochromatic emulsions.

| Paint color | Pigment | Fluorescent ingredient |
|---|---|---|
| Process blue (blue-green) | 16% patent blue lake<br>42% silicon dioxide<br>42% blanc fixe | 6% chrysene |
| Yellow | 10% hansa yellow<br>42.5% silicon dioxide<br>42.5% blanc fixe | 5% anthracene containing naphthacene (1%) |
| Magenta | 5% rhodamine B lake<br>1% toluidine toner<br>14% silicon dioxide<br>14% blanc fixe | 66% gum sandarac containing rhodamine G (1%) |
| Green | 29% elgin green<br>1% rhodamine B lake | 50% chrysene<br>20% anthracene containing naphthacene (1%) |
| Orange red (primary red) | 3% hansa yellow<br>17% toluidine toner | 55% gum sandarac containing rhodamine G (1%)<br>25% anthracene containing naphthacene (1%) |
| Light orange red | 0.5% hansa yellow<br>1.7% toluidine toner<br>47% silicon dioxide<br>47% blanc fixe | 2.7% gum sandarac containing rhodamine G (1%)<br>1.1% anthracene containing naphthacene (1%) |
| Purple (primary blue) | 50% of above magenta paint<br>50% of above process blue paint | |
| Orange | 50% of above yellow paint<br>50% of above orange red paint | |
| Yellow green | 50% of above yellow paint<br>50% of above green paint | |
| Greenish blue | 50% of above process blue paint<br>50% of above green paint | |

From the above it will be seen that chrysene is the fluorescent ingredient corresponding to hue III in Fig. 2, anthracene plus 1% naphthacene or chrysene with 1% naphthacene is the ingredient corresponding to hue II, and sandarac containing rhodamine G is the one corresponding to hue I.

Blanc fixe is a commercial barium sulfate ($BaSO_4$). Chrysene can be prepared as described in Yule's copending application mentioned above. In determining the proportions of the fluorescent ingredients in the above paints, the green was made up first with the maximum possible fluorescence. This, of course, determines the strength of the hue II and hue III fluorescence required in the other paints. The (deep) orange red was then made up relating the hue II to the hue I and fixing the amount of hue I florescence required; exposure times are selected to make the brightness of the fluorescent hues effectively equal.

In each case the solid materials given in the above table are ground to a suitable consistency in an aqueous solution of gum arabic (30% solution) or other suitable vehicle.

Thus we have a palette of artists' colors having incorporated in each a quantity of fluorescent ingredient (effectively) directly proportional to one of the subtractive color contents of that one. That is, the amounts of any one of the fluorescent ingredients in the different coloring materials are proportional (not necessarily linearly) to the subtractive color contents of the materials and inversely proportional (again not necessarily linearly) to the fluorescent efficiency of the ingredient in those materials. The fluorescent efficiency depends on the absorption by each material of the fluoro-activating light and of the fluorescent light. It is not necessary that the amounts of the different ingredients bear any special relation to one another since different times of exposure are given for each hue.

In a special embodiment of the invention which is particularly useful in the reproduction of pen and color wash drawings such as used in comic strips in color, maps, and labels, a pen drawing is made with a non-fluorescent black ink or non-fluorescent white base and is then tinted with washes of fluorescent paints such as those described above. The color separation positives are made using the light sources and filters above described, but none of the printers will have any printing density at the points corresponding to the black lines in the original. The original is then illuminated with a light source rich in infrared such as incandescent tungsten, the filter is changed to a Wratten 88A, and an exposure is made on a high contrast infrared sensitive plate. Upon development, this gives a negative of the black pin lines only with no trace of the colors. A contact positive made on a high contrast plate such as Kodalith completes the set of color positives to be used in so-called four-color reproduction. In the latter process, highlight green negatives are made from the color separation positives and a line negative is made from the black positive. These are printed on metal and etched in the usual manner to produce a set of printing plates.

In common with the broad process, this special embodiment has the following advantages. Color correction is completely eliminated. The step of making separation negatives is also eliminated. A large density jump can be created between the white background and the lightest color tints because, being non-fluorescent the background density is not increased by exposure. This results in a positive from which "highlight" negatives are easily made and thus manual opaquing of the highlights on negatives is unnecessary. Correct color positives for photogravure and collotype can be made in a single photographic step.

This special embodiment has the additional advantages that the black pen lines are eliminated from the color separations automatically. Also this process provides that color comics can be properly reproduced by an economical photographic process, freeing the art from the limitations of the Ben Day process now used.

Sometimes this special embodiment is a little difficult to operate if the original contains fine black lines because when the three colors are not properly in register with the black, white lines appear. This is due to the fact that the presence of the black lines in the original, even if underlying the other colors, greatly reduce the fluorescence. This may be overcome by making the black outline drawing first and then overlying this outline with translucent material such as tracing paper and coloring on the translucent material. The black outline drawing and the overlay are separately photographed. Of course, it is not necessary to restrict the photographing of the black outline drawing to infrared or any other specific type in this case. Alternatively the black outline can be made with a bleachable black ink which is bleached before making the color separations.

Having described two embodiments of the present invention, I wish to point out that it is not limited to these embodiments, but is of the scope of the appended claims.

What we claim and desire to secure by Letters Patent of the United States is:

1. A palette of artist's coloring materials incorporating among them three different fluorescent ingredients whose fluorescent hues are mutually separable spectrally, the ingredients corresponding respectively to the subtractive colors, yellow, magenta, and blue-green, there being at least one material having a yellow content, one having a magenta content and one having a blue-green content and there being at least two materials having one of the subtractive color contents in common, and for each ingredient respectively the quantities thereof in any pair of materials having the corresponding subtractive color content being directly proportional to the amounts of that subtractive color content in the two materials and inversely proportional to the fluorescent efficiency of the ingredient in those materials.

2. A palette of at least four artist's coloring materials containing among them three fluorescent ingredients corresponding respectively to the three subtractive colors, the amounts of each ingredient which occurs in two of the materials being effectively in proportion to the amounts of the corresponding subtractive color contents of those materials, the fluorescent hues of the ingredients being mutually separable spectrally.

3. A palette of artist's coloring materials comprising at least three distinctively colored materials, each containing a different fluorescent ingredient, the fluorescent hues of the three ingredients being mutually separable spectrally.

4. A palette according to claim 3 in which one of said materials fluoresces only in the green region of the spectrum, another fluoresces only shorter wavelengths and the third fluoresces only longer wavelengths.

5. A palette according to claim 3 in which one fluorescent ingredient is substantially pure chrysene fluorescing only wavelengths shorter than green, a second ingredient fluoresces only in the green region of the spectrum and the third fluoresces only longer wavelengths.

6. A palette according to claim 3 in which one fluorescent ingredient is substantially pure chrysene, a second ingredient is anthracene containing naphthacene and the third ingredient is gum sandarac containing rhodamine G.

7. A palette of artist's coloring materials comprising a magenta, a yellow and a blue-green material, each containing a different fluorescent ingredient, the fluorescent hues of the three ingredients being mutually separable spectrally.

8. A palette of artist's coloring materials including a magenta, a yellow, a blue-green, a white, a black, and other materials each having two subtractive color contents, the white containing no fluorescent ingredient, the magenta, the yellow and the blue-green respectively containing three different fluorescent ingredients whose fluorescent hues are mutually separable spectrally and each of said other materials containing at least two of the three fluorescent ingredients, the amounts of each ingredient in any two materials whose hues have the corresponding subtractive color content in common being proportional to the amounts of said subtractive color contents and being inversely proportional to the fluorescent efficiency of that ingredient in those materials.

9. A palette of artist's coloring materials including a black one which contains no fluorescent ingredient and at least four others which contain among them three fluorescent ingredients corresponding to the three subtractive colors, and for each ingredient respectively the amounts in any pair of materials which include that ingredient being proportional to the corresponding subtractive color contents of the hues of said pair of materials and being in inverse proportion to the fluorescent efficiencies of that ingredient in those materials, the fluorescent hues of the ingredients being mutually separable spectrally.

10. A palette of artist's coloring materials of at least four different hues and containing among them three fluorescent ingredients each corresponding to one of the subtractive colors, the fluorescent hues of the ingredients being mutually separable spectrally and for each ingredient respectively the amounts in the different materials having the corresponding subtractive color contents in their hues being proportional to said subtractive color contents of those materials and inversely proportional to the fluorescent efficiency of the ingredient in those materials.

ALEXANDER MURRAY.
JOHN A. C. YULE.